United States Patent [19]

Omura et al.

[11] Patent Number: 5,225,356
[45] Date of Patent: Jul. 6, 1993

[54] METHOD OF MAKING FIELD-EFFECT SEMICONDUCTOR DEVICE ON SOT

[75] Inventors: Yasuhisa Omura; Katsutoshi Izumi, both of Kanagawa, Japan

[73] Assignee: Nippon Telegraph & Telephone Corporation, Japan

[21] Appl. No.: 815,815

[22] Filed: Dec. 30, 1991

[30] Foreign Application Priority Data

Jan. 14, 1991 [JP]  Japan ................................. 3-16093

[51] Int. Cl.$^5$ .................... H01L 21/265; H01L 21/86
[52] U.S. Cl. .......................... 437/21; 148/DIG. 150; 257/347; 257/354
[58] Field of Search ............... 437/21; 148/DIG. 150; 257/347, 348, 350, 354

[56]  References Cited

U.S. PATENT DOCUMENTS

| | | | |
|---|---|---|---|
| 4,772,927 | 9/1988 | Saito et al. | 437/21 |
| 4,809,056 | 2/1989 | Shirato et al. | 257/354 |
| 4,965,213 | 10/1990 | Blake | 437/21 |
| 5,047,356 | 9/1991 | Li et al. | 437/21 |
| 5,073,506 | 12/1991 | Marzara et al. | 437/21 |

FOREIGN PATENT DOCUMENTS

| | | |
|---|---|---|
| 63-237573 | 10/1988 | Japan . |
| 1-55867 | 3/1989 | Japan . |
| 2-144969 | 6/1990 | Japan . |

OTHER PUBLICATIONS

Y. Omura et al., "A 21.5 ps/Stage Ultra-Thin-Film CMOS/SIMOX at 2.5 V Using a 0.25-m Polysilicon Gate", 4th Symposium on SOI Technology & Devices, ESC, May 1990, Montréal, pp. 509–517.

*Primary Examiner*—Olik Chaudhuri
*Assistant Examiner*—Long Pham
*Attorney, Agent, or Firm*—Blakely, Sokoloff, Taylor & Zafman

[57]  ABSTRACT

A field-effect semiconductor device of this invention includes a first insulating film formed on a semiconductor substrate, a source region of a second conductivity type and a drain region of the second conductivity type, which are arranged on the insulating film and are formed on both the sides of a semiconductor active layer of a first conductivity type, a second insulating film for covering the top and side surfaces of the semiconductor active layer, the source region, and the drain region, a gate electrode arranged on the second insulating film corresponding to the semiconductor active layer, a non-oxidizable third insulating film arranged on the second insulating film for covering the side surfaces of the semiconductor active layer and the source and drain regions, and the other regions, a fourth insulating film arranged on the non-oxidizable third insulating film, a fifth insulating film for covering a portion of the third insulating film located on the side surfaces of the source and drain regions, the fourth insulating film, the semiconductor active layer, the second insulating film arranged on the top surfaces of the source and drain regions, and a gate electrode arranged on the second insulating film, and a source electrode and a drain electrode arranged on the fifth insulating film and connected to the source region and the drain region, respectively, through contact holes formed in the fifth insulating film and the second insulating film.

3 Claims, 9 Drawing Sheets

METHOD OF MAKING FIELD-EFFECT SEMICONDUCTOR DEVICE ON SOI

BACKGROUND OF THE INVENTION

The present invention relates to a field-effect semiconductor device and, more particularly, to a field-effect semiconductor device formed on an insulating layer and a method of manufacturing the same.

FIG. 3 shows an example of a conventional field-effect semiconductor device. Referring to FIG. 3, reference numeral 1 denotes a monocrystalline silicon substrate; and 2, an insulating layer formed on this semiconductor substrate. This insulating layer 2 is an insulating film such as a silicon oxide film for electrically insulating an active layer 3 formed on the insulating layer 2 and having a first conductivity type, e.g., a p type from the monocrystalline semiconductor substrate 1. Reference numeral 4 denotes a gate insulating film such as a silicon oxide film; 5, a source region of a second conductivity type, e.g., an n type; and 6, a drain region of the second conductivity type, i.e., the n type. The source region 5, the active layer 3, and the drain region 6 are arranged adjacent to each other in the order named on the insulating film 2. Reference numeral 7 denotes a gate electrode arranged on the gate insulating film 4 corresponding to the active layer 3; 8a, 8b, and 8c, insulating films to electrically insulate interconnecting layers; 9, a source electrode; and 10, a drain electrode.

In a semiconductor device of this type, the impurity concentration of the active layer 3 is designed such that the thickness of a depletion layer which may expand from the gate electrode side is larger than a thickness $t_0$ of the active layer 3, and consequently the entire region of the active layer is depleted when the semiconductor device is in operation. The reasons for this arrangement are: (1) the mobility deterioration of carriers at inverted surface immediately below the gate insulating film 4 can be suppressed by reducing the effective electric field strength in the active layer, and thereby the drain current can be increased, and (2) the drain current can increase with an increase in carriers at inverted surface in the active layer, corresponding to a reduction in a charge amount in the depletion layer formed. In addition, in a semiconductor device having the above arrangement, since the active layer 3 is depleted by a gate-induced electric field, it is possible to suppress an incursion of a drain electric field from a drain junction into the active layer 3, and in this manner the short channel effect in a threshold voltage can be suppressed. Accordingly, a semiconductor device of this type is expected to realize both a high-density integration of a semiconductor device obtained by down scaling in dimensions and a high-speed operation and therefore has attracted attention as a promising device in recent years.

FIGS. 4A to 4E show a practical example of a method of manufacturing the semiconductor device shown in FIG. 3.

First, as shown in FIG. 4A, a silicon oxide film 2 is buried in, e.g., a monocrystalline silicon semiconductor 1, and a first silicon semiconductor layer 11 is formed on the silicon oxide film 2, thereby preparing a silicon semiconductor structure. This semiconductor structure is formed by implanting oxygen ions into, e.g., a monocrystalline semiconductor.

Subsequently, as shown in FIG. 4B, the first semiconductor layer 11 on the major surface side of the semiconductor structure is formed into predetermined dimensions by, e.g., an anisotropic plasma etching technique, thus forming a silicon semiconductor layer $11_1$.

As shown in FIG. 4C, a predetermined impurity is doped into the silicon semiconductor region $11_1$ by, e.g., an ion-implantation technique to form an active layer 3 of a first conductivity type (p type). Thereafter, a silicon oxide film 4 as a gate insulating film, for example, is formed on the active layer 3, and subsequently a doped silicon layer 12, for example, as a gate electrode is deposited.

As shown in FIG. 4D, the gate electrode silicon layer 12 is formed into predetermined dimensions by, e.g., the anisotropic plasma etching technique to form a gate electrode 7. Thereafter, a source region 5 of a second conductivity type (n type) and a drain region 6 of the same conductivity type are formed by, e.g., the ion-implantation technique. An insulating film 8, such as a silicon oxide film, is deposited on the major surface side of the semiconductor substrate, contact holes 8A and 8B are formed on the source region 5 and the drain region 6, and a metal layer as an electrode interconnection is deposited. Thereafter, this metal layer is processed to form a source electrode 9 and a drain electrode 10.

Note that FIG. 4E shows a section obtained by cutting the gate of the semiconductor device shown in FIG. 4D in a direction perpendicular to the drawing surface, in which reference numeral 13 denotes an interconnection for connecting the gate electrode 7 to another device.

FIG. 5 shows the results obtained by measuring the relationship between the threshold voltage and the gate length in a semiconductor device of this type actually manufactured by the method as described above. That is, FIG. 5 shows the relationship between the change in threshold voltage and the gate length on the basis of the threshold voltage of a semiconductor device with a gate length of 0.7 μm. Referring to FIG. 5, $t_0$ indicates the thickness of the silicon active layer 3 of the semiconductor device used in the measurement, and $t_1$ (shown in FIG. 4E) indicates the thickness of the silicon oxide film 2 arranged below the active layer 3. Note that in FIG. 5, a curve I represents the result obtained when $t_0=50$ (nm) and $t_1=500$ (nm), and a curve II represents the result obtained when $t_0=50$ (nm) and $t_1=200$ (nm). FIG. 5 reveals that when the thickness $t_1$ of the silicon oxide film 2 is small, the change in threshold voltage is also small if the gate channel length is shortened, and in this manner the short channel effect is suppressed. Therefore, in order to realize down scaling of a semiconductor device of this type, it is essential to decease the thickness of the silicon oxide film 2.

When the thickness $t_1$ of the silicon oxide film decreases, however, (1) a parasitic capacitance at the drain region 6 of the semiconductor device increases. In addition, (2) in the conventional manufacturing method as described above, a thickness $t_2$ of the insulating film located below the electrode interconnection shown in FIG. 4D decreases. This decrease in thickness results in a large increase in parasitic capacitance at interconnections for connecting semiconductor devices upon integration of the devices, and this makes it difficult to realize a high-speed operation of the semiconductor device. Note that it is clear from computations that the increase in parasitic capacitance described in item (1) above actually has no influence on realization of a high-speed operation if the thickness $t_1$ of the silicon oxide film 2 is 10 times or more the thickness of the silicon oxide film 4 as a gate insulating film.

On the other hand, since the interconnection length in an LSI circuit reaches about 1 cm, the increase in parasitic capacitance below the interconnection has a large influence on the operating speed of the circuit. In addition, as shown in FIG. 4E, in order to form the interconnection 13 for connecting the gate electrode 7 to another device, the gate electrode must be excessively extracted onto the insulating film 2. When the thickness $t_1$ of the insulating film 2 decreases, the parasitic capacitance of this portion becomes too large to be neglected and adversely affects the operating speed of the device.

A field-effect semiconductor device of this type, therefore, has not been put into practical use yet because it has the problems as described above as well as several good characteristics.

SUMMARY OF THE INVENTION

It is, therefore, a principal object of the present invention to provide a field-effect semiconductor device and a method of manufacturing the same, in which the parasitic capacitance in an interconnection for connecting a gate electrode to another interconnection can be suppressed to increase the operating speed.

It is another object of the present invention to provide a field-effect semiconductor device and a method of manufacturing the same, in which the capacitance in interconnections for connecting field-effect semiconductor devices can be suppressed to increase the operating speed.

It is still another object of the present invention to provide a field-effect semiconductor device and a method of manufacturing the same, in which down scaling of the device is realized as well as the above objects.

It is still another object of the present invention to provide a field-effect semiconductor device and a method of manufacturing the same, in which even when the thickness of an insulating layer arranged below an active layer of the device is decreased to reduce the short channel effect, increases in parasitic capacitance and interconnection capacitance of the semiconductor device can be suppressed to realize a high-speed operation even in an LSI circuit.

It is still another object of the present invention to provide a field-effect semiconductor device and a method of manufacturing the same, which can achieve the above objects by performing a self-alignment technique after lithography is performed only once.

In order to achieve the above objects, in the present invention, a non-oxidizable insulating film is arranged on at least almost the entire region on the major surface side except for the upper surface of an active layer.

According to the first aspect of the present invention, therefore, there is provided a field-effect semiconductor device comprising a first insulating film formed on a semiconductor substrate, a source region of a second conductivity type and a drain region of the second conductivity type, which are arranged on the insulating film and are formed on both the sides of a semiconductor active layer of a first conductivity type, a second insulating film for covering top and side surfaces of the semiconductor active layer, the source region, and the drain region, a gate electrode arranged on the second insulating film corresponding to the semiconductor active layer, a non-oxidizable third insulating film arranged on the second insulating film for covering the side surfaces of the semiconductor active layer and the source and drain regions, and the other regions, a fourth insulating film arranged on the non-oxidizable third insulating film, a fifth insulating film for covering a portion of the third insulating film located on the side surfaces of the source and drain regions, the fourth insulating film, the semiconductor active layer, the second insulating film arranged on the top surfaces of the source and drain regions, and a gate electrode arranged on the second insulating film, and a source electrode and a drain electrode arranged on the fifth insulating film and connected to the source region and the drain region, respectively, through contact holes formed in the fifth insulating film and the second insulating film.

According to another aspect of the present invention, there is provided a method of manufacturing a field-effect semiconductor device, comprising the steps of preparing a semiconductor structure in which a first insulating film is formed on a semiconductor substrate and a first semiconductor layer is formed on the first insulating layer, processing the first semiconductor layer to have predetermined planar dimensions, forming a second insulating film on top and side surfaces of the processed first semiconductor layer, depositing a third non-oxidizable insulating film on a major surface of the semiconductor structure, depositing a second semiconductor layer on the third non-oxidizable insulating film, forming a fourth insulating film on the second semiconductor layer, depositing a fifth non-oxidizable insulating film on the fourth insulating film, processing the fifth non-oxidizable insulating film to have dimensions covering the region of the first semiconductor layer processed into predetermined planar dimensions, oxidizing the second semiconductor layer by using the fifth non-oxidizable insulating film as a mask, thereby changing a major region into a semiconductor oxide, removing the fifth non-oxidizable insulating film and the fourth insulating film remaining under the fifth non-oxidizable insulating film to expose the second semiconductor layer remaining under the fourth insulating film, etching the second semiconductor layer to expose the third non-oxidizable insulating film on the processed first semiconductor layer, changing the second semiconductor layer partially remaining on a periphery of the processed first semiconductor layer into an oxide, and etching the third non-oxidizable insulating film exposed on a major surface side of the semiconductor structure to expose the second insulating film.

DETAILED DESCRIPTION OF THE PREFERRED EMBODIMENTS

FIGS. 1A to 1L show an embodiment of a field-effect semiconductor device according to the present invention and a method of manufacturing the same.

Figure 1A:
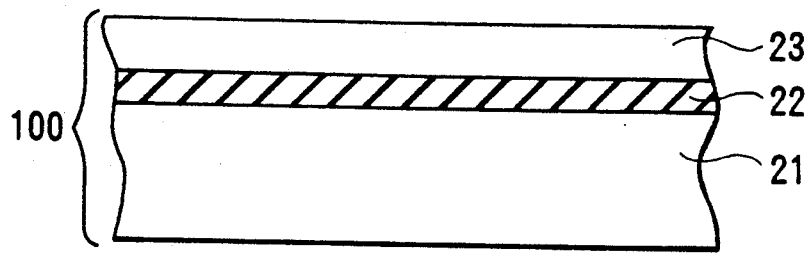
FIGS. 1A to 1K are sectional views showing an embodiment of a field-effect semiconductor device according to the present invention and a method of manufacturing the same.

The method of manufacturing the field-effect semiconductor device of the present invention will be described below with reference to FIGS. 1A to 1L. First, as shown in FIG. 1A, an insulating layer, e.g., a silicon oxide layer 22 having a thickness of 100 nm is buried in a monocrystalline silicon semiconductor 21, and a first silicon semiconductor layer 23 having a thickness of 100 nm is formed on this insulating layer, thereby preparing a semiconductor structure 100. In this case, the silicon oxide layer 22 is formed by implanting oxygen ions into the monocrystalline silicon semiconductor. Such a semiconductor structure can be formed by forming an insulating film on a silicon substrate and forming a monocrystalline semiconductor layer by bonding.

Figure 1B:
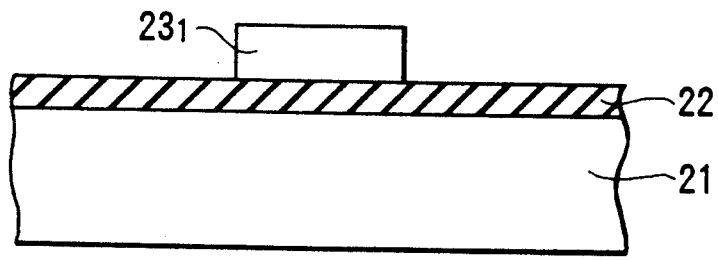

Subsequently, as shown in FIG. 1B, the first semiconductor layer 23 is subjected to an anisotropic etching technique, e.g., a reactive ion-etching technique to form a region $23_1$ serving as a semiconductor active layer. In this case, the RF power density is 5 to 6 W/cm², the gas used is $Cl_2$, the pressure is 10 Pa, and the etching time is five minutes.

Figure 1C:
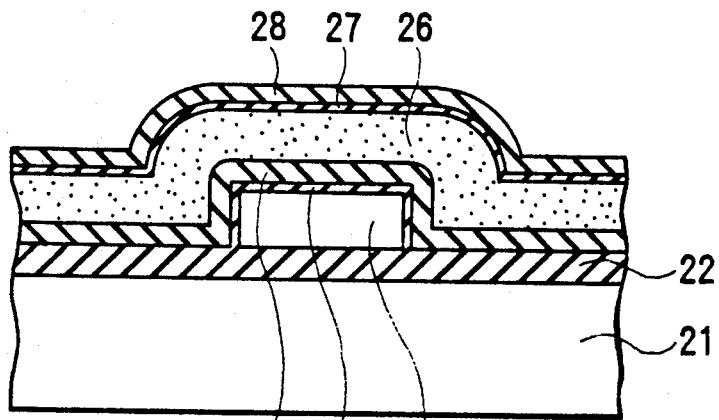

As shown in FIG. 1C, a silicon oxide film 24 is formed on the region $23_1$ serving as a semiconductor active layer by performing, e.g., thermal oxidation on the surface of the region $23_1$. In this case, the oxide film 24 is formed to have a thickness of 10 nm by supplying 5 l/min of oxygen at 900° C. for 30 minutes. Subsequently, a non-oxidizable insulating film 25, such as a silicon nitride film, is deposited on the major surface side of the semiconductor substrate, and a silicon semiconductor film 26, for example, is deposited on the insulating film 25. An insulating film 27 is formed by oxidizing the surface of the semiconductor film 26, and a non-oxidizable insulating film 28, such as a silicon nitride film, is deposited on the insulating film 27. In this case, the silicon nitride films 25 and 28 are formed through a low pressure CVD method to have thicknesses of 100 nm and 150 nm, respectively, in an $NH_3 + SiH_2Cl_2$ gas atmosphere at 850° C. for 40 minutes and 60 minutes, respectively. The silicon semiconductor film 26 is similarly formed by the low pressure CVD method. However, the gas used is $SiH_4$, and the film is formed to have a thickness of 100 nm at 600° C. for 10 minutes. The insulating film 27 is formed to have a thickness of 10 nm by supplying 5 l/min of oxygen at 900° C. for 30 minutes.

Figure 1D:
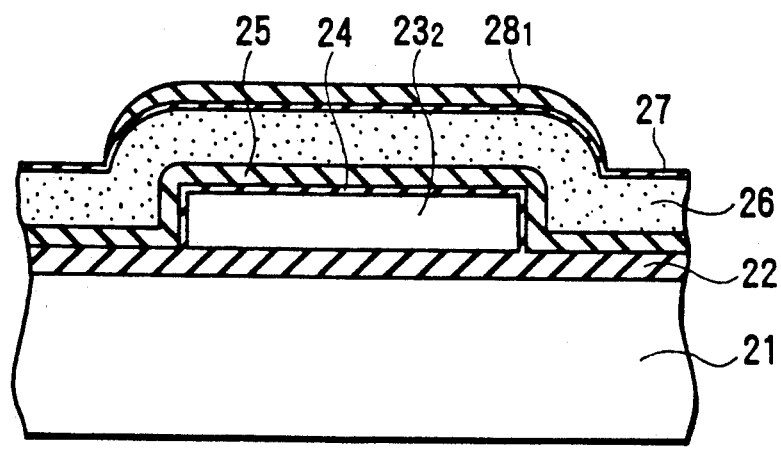

Subsequently, as shown in FIG. 1D, the insulating film 28 is processed to form an insulating film $28_1$ such that the semiconductor active layer covered with the insulating film 24 cannot be seen when viewed from the above, i.e., when viewed from the above on the major surface side of the semiconductor substrate. A reactive ion-etching technique is used as the etching technique for this insulating film 28. The etching is performed under the conditions of, for example, RF power density=0.1 to 0.15 W/cm², flow rate ratio of $CF_4+H_2$ gases=65:35, pressure=3 Pa, and temperature=room temperature. During the etching, in this embodiment, the insulating film 27 is exposed on portions where no insulating film 28 is present.

Figure 1E:
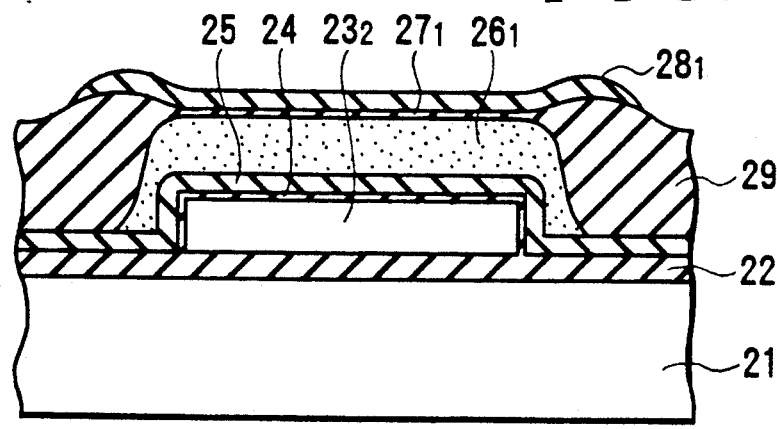

As shown in FIG. 1E, the exposed portions of the insulating film 27 are removed by etching, and the resulting exposed semiconductor layer 26 is oxidized to the interface between the semiconductor layer 26 and the insulating film 25 through a self-alignment technique by using the insulating film $28_1$ as a mask, thereby forming a silicon oxide film 29. In this case, the oxidation of the semiconductor layer 26 is performed by, e.g., a hydrogen combustion oxidizing method by supplying $H_2$ (3 l/min)+$O_2$ (5 l/min) gases at a temperature of 900° C. for 120 minutes. Note that in this step, if the insulator 27 consists of a silicon oxide film, the insulator 27 need not be removed but the major surface side of the semiconductor substrate may be directly exposed to an oxygenous ambient to oxidize the semiconductor layer 26.

Figure 1F:
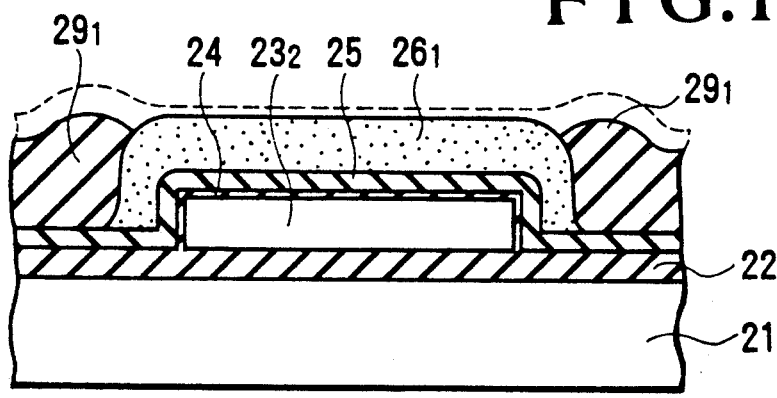

Next, as shown in FIG. 1F, the insulating film $28_1$ is removed, and subsequently an insulating film $27_1$ remaining on a semiconductor layer $26_1$ is removed to expose the semiconductor layer $26_1$. In this case, the removal of the silicon nitride film 28 is performed through etching by dipping the substrate in phosphoric acid (160° C.) for 60 minutes.

Figure 1G:
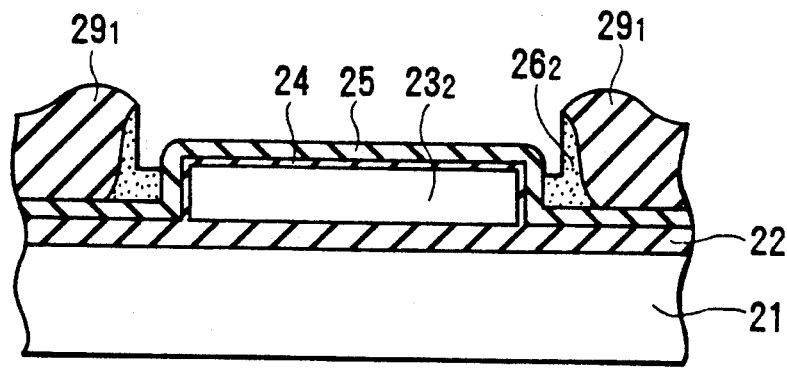

As shown in FIG. 1G, the remaining semiconductor layer $26_1$ is etched by a reactive ion-etching technique with strong anisotropy until the insulating film 25 on a region $23_2$ is exposed. As a result, a semiconductor layer $26_2$ remains only around the semiconductor layer $23_2$, particularly on a portion adjacent to most of the side walls. In this case, an ECR stream etching technique, for example, is performed as the etching, and the reaction is caused under the conditions of RF power density=5 to 6 W/cm², gas used=$Cl_2$, and pressure=10 Pa, for five minutes.

Figure 1H:
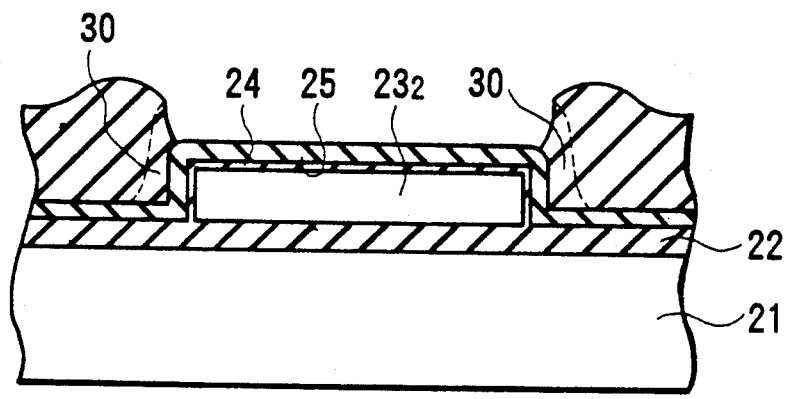

Subsequently, as shown in FIG. 1H, the major surface side of the semiconductor substrate is thermally oxidized to change most of the semiconductor layer $26_2$ into a silicon oxide 30. In this stage, the semiconductor layer $26_2$, together with a silicon oxide film $29_1$ located around the semiconductor layer $26_2$, is changed into the silicon oxide, and consequently almost the entire portion around the semiconductor active layer becomes an insulator. In this case, the oxidation is performed through, e.g., a hydrogen combustion oxidizing method by supplying $H_2$ (3 l/min)+$O_2$ (5 l/min) gases at a temperature of 900° C. for 60 minutes.

Figure 1I:
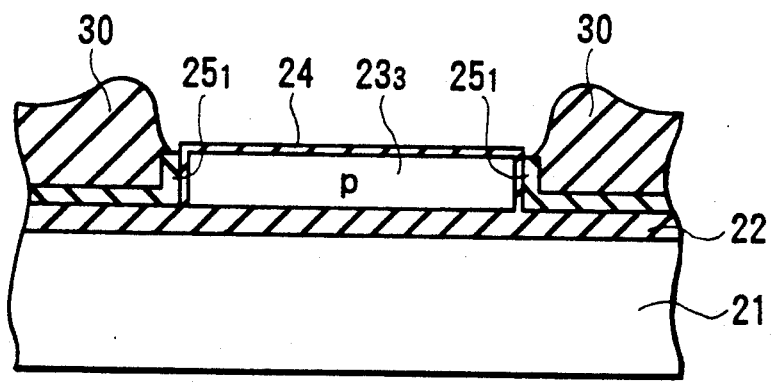

As shown in FIG. 1I, the exposed portion of the insulating film 25 is etched away to expose the insulating film 24. Thereafter, an impurity is doped into the semiconductor active layer $23_2$ by, e.g., an ion-implantation technique to impart a first conductivity type to a semiconductor active layer $23_3$. In this case, the removal of the silicon nitride film 25 is performed through etching by dipping the substrate into phosphoric acid (160° C.) for 40 minutes.

Figure 1J:
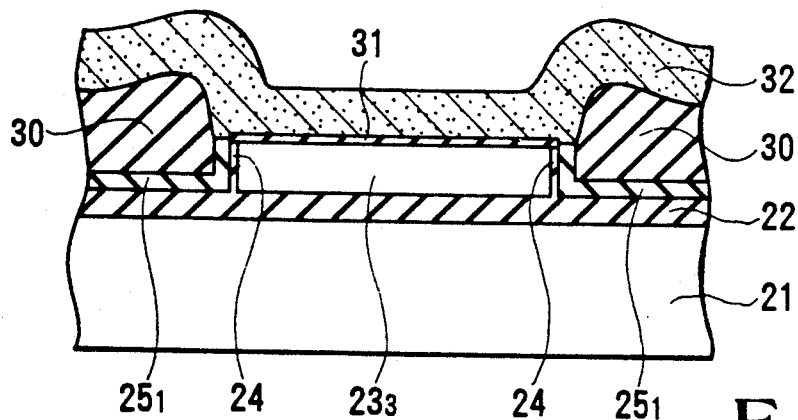

Subsequently, as shown in FIG. 1J, after the insulating film 24 is removed, the exposed surface of the semiconductor active layer $23_3$ is oxidized to form a gate oxide film 31, and a doped silicon semiconductor layer 32 to be used as a gate electrode is deposited on the major surface side of the semiconductor substrate.

Figure 1K:
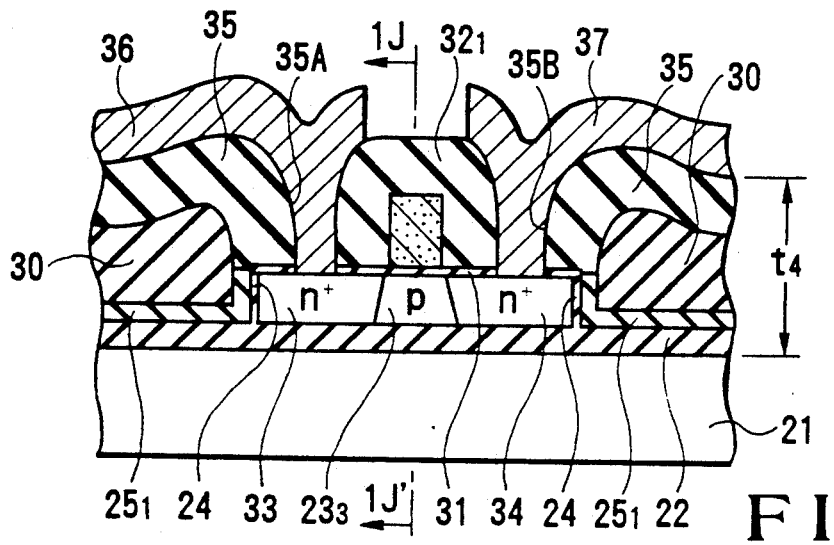

Next, as shown in FIG. 1K, the semiconductor layer 32 is processed into predetermined dimensions to form a gate electrode $32_1$, and a source region 33 of a second conductivity type (n+) and a drain region 34 of the same conductivity type are formed by, e.g., the ion-implantation technique. Thereafter, an insulating film 35 is deposited on the major surface side of the semiconductor substrate, and contact holes 35A and 35B are formed on the source and drain regions, respectively. Lastly, a source electrode 36 and a drain electrode 37 are formed.

Figure 1L:
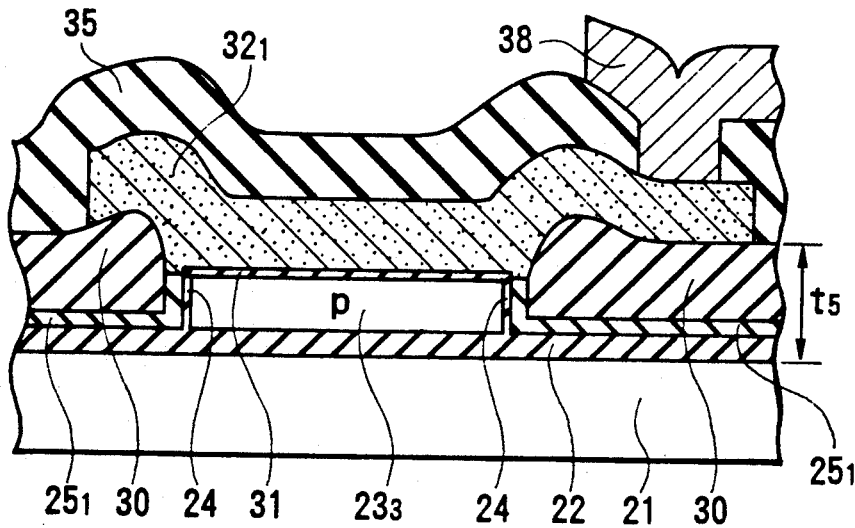
FIG. 1L is a view showing a section obtained by cutting the gate electrode of the semiconductor device shown in FIG. 1K in a direction (1J - 1J') perpendicular to the drawing surface.

FIG. 1L shows a cross section obtained by cutting the gate electrode of the semiconductor device shown in FIG. 1K in the direction of line 1J - 1J', i.e., in the direction of gate width. In the conventional manufacturing method shown in FIG. 4E, the thickness ($t_1$) of the insulating film is very thin in a portion where the gate electrode silicon film 7 extends from the active region, and this unnecessarily increases the parasitic capacitance of the gate. By contrast, as shown in FIG. 1L according to the manufacturing method of the present invention, the thickness ($t_5$) of the insulating film in a portion where the gate electrode silicon film $32_1$ extends from the active region is the total thickness of the layers 30, $25_1$, and 22. As a result, since the total thickness of the insulating films in this portion is much larger than that in the conventional structure, it is possible to drastically decrease the parasitic capacitance of the gate. Note that in FIG. 1L, reference numeral 38 denotes a gate extracting electrode for connecting the gate electrode $32_1$ to another device.

Figure 2:
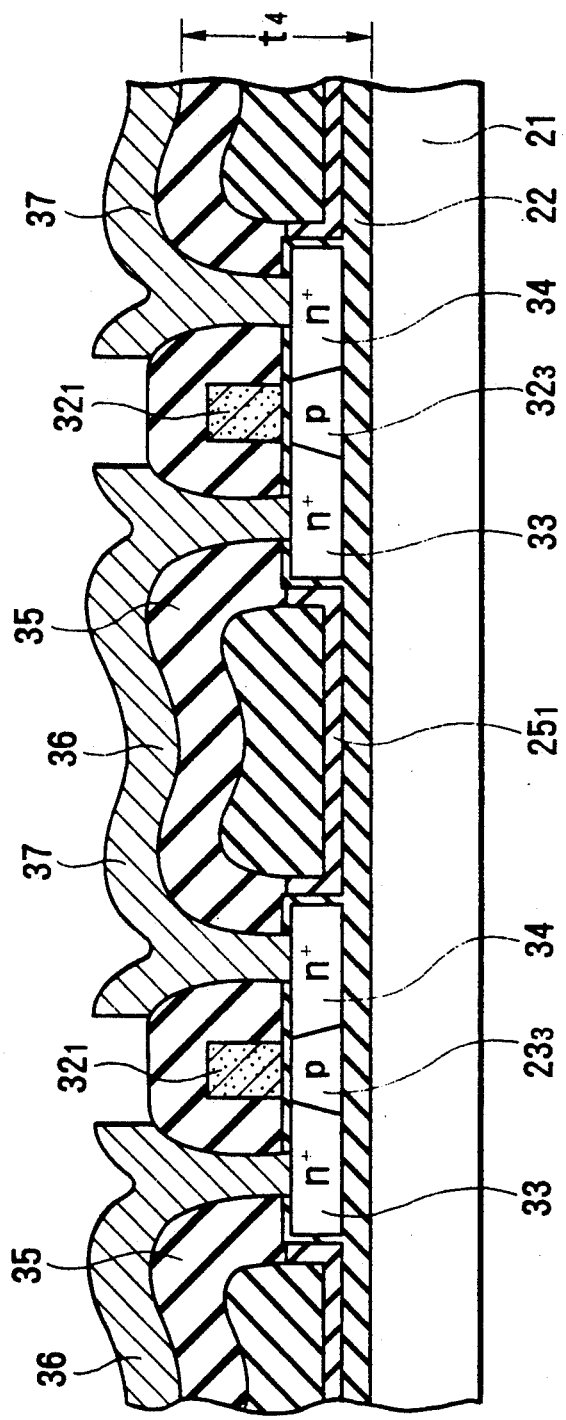
FIG. 2 is a sectional view showing a state in which the field-effect semiconductor device of the present invention is actually incorporated in an integrated circuit.
Figure 3:
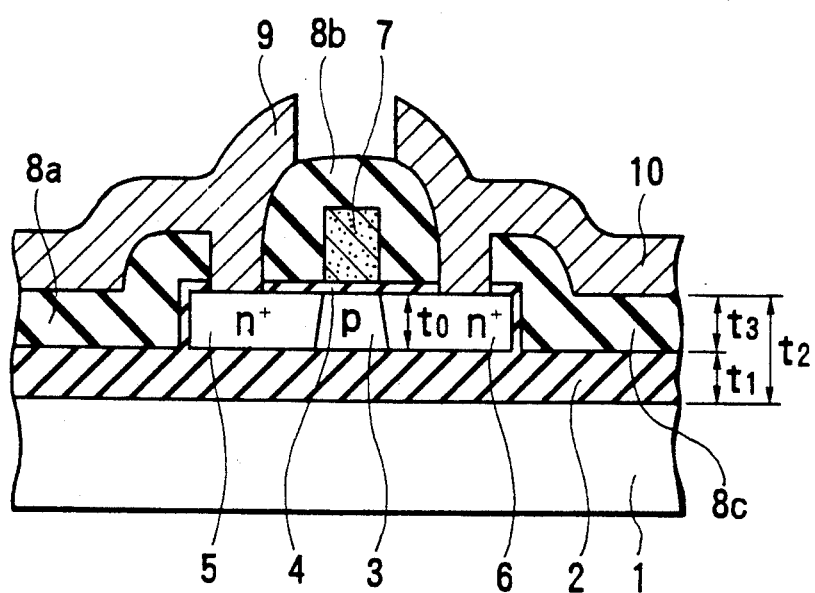
FIG. 3 is a sectional view showing an example of a conventional field-effect semiconductor device.

FIG. 2 shows an embodiment of a semiconductor device manufactured by the manufacturing method of the present invention. Referring to FIG. 2, a plurality of semiconductor devices are formed on an insulating film 22 and electrically connected with each other. It is apparent from this structure that the semiconductor device of the present invention can be easily applied to an LSI circuit.

The characteristic feature of the manufacturing method of the present invention is that a non-oxidizable insulating film (e.g., a silicon nitride film) $25_1$ is arranged on the entire surface of an insulating film 22 except for an active region of a semiconductor device, and that this non-oxidizable insulating film $25_1$ is arranged on all side surfaces except for the top surface of the active layer. This arrangement is adopted for the reasons to be explained below.

Figure 4A:
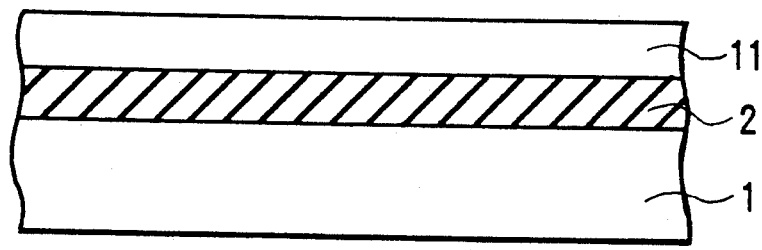
FIGS. 4A to 4D are sectional views showing an example of a method of manufacturing the conventional semiconductor device.
Figure 4B:
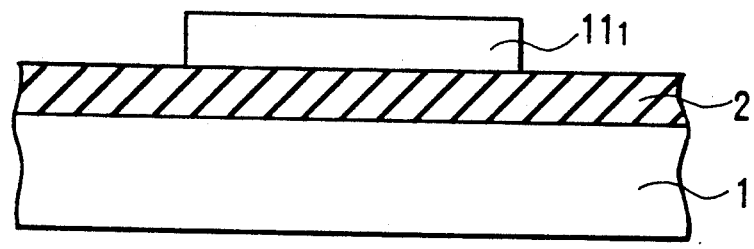
Figure 4C:
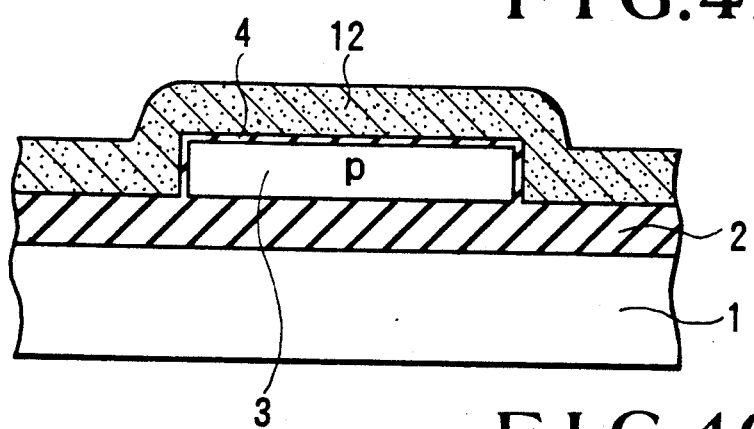
Figure 4D:
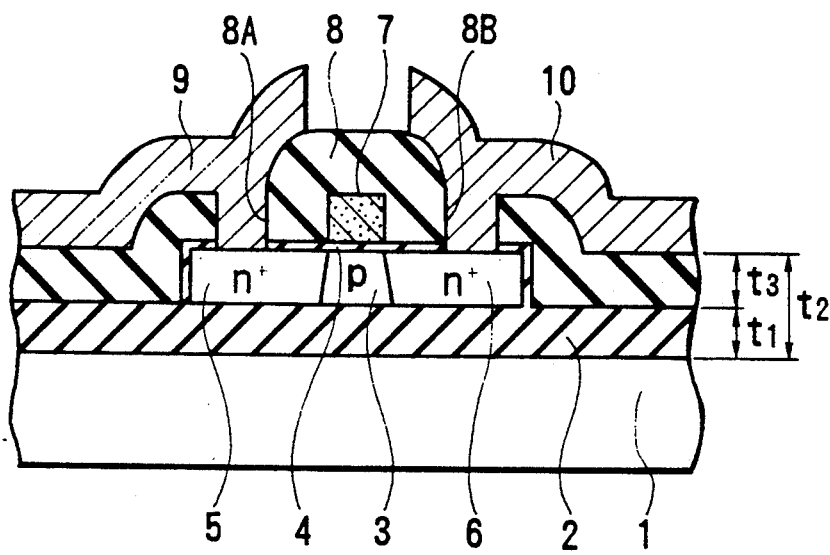
Figure 4E:
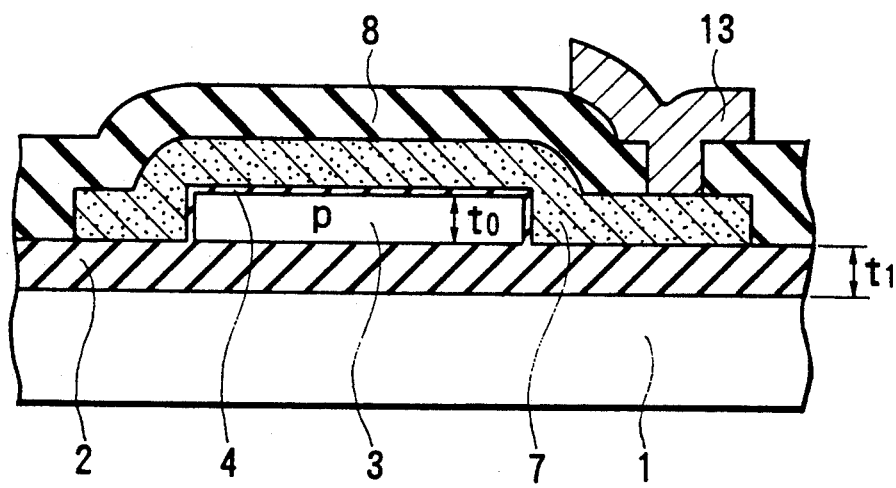
FIG. 4E is a view showing a section obtained by cutting the gate electrode of the semiconductor device of FIG. 4D in a direction perpendicular to the drawing surface.
Figure 5:
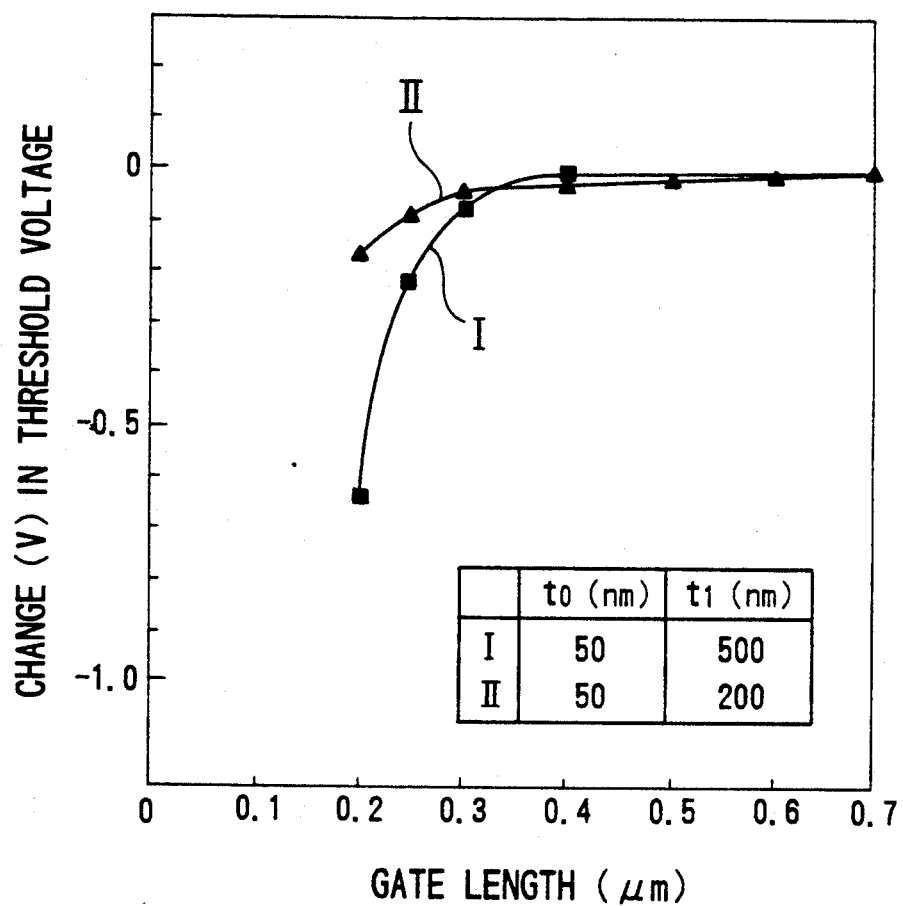
FIG. 5 is a graph showing the results obtained by measuring the relationship between the threshold voltage and the gate length of a semiconductor device of this type actually manufactured by a conventional method.

That is, in conventional techniques, an active layer is electrically isolated by forming it to have an island-like shape, as shown in FIG. 4B. As a method of isolating an active layer, on the other hand, there is a conventionally known method in which, in FIG. 4B, a non-oxidizable insulating film having a predetermined planar shape is formed on a semiconductor layer $11_1$ and a semiconductor substrate is then exposed to an oxygenous ambient so that an exposed region of the semiconductor layer is replaced with an oxide film (selective oxidation: LOCOS technique).

In this method, however, when the semiconductor layer $11_1$ is oxidized in the direction of thickness, it is practically difficult to stop the oxidation exactly when the front surface of the oxidation reaction reaches a buried insulating film 22. This is because extra oxidation is required because a variation in thickness of the semiconductor layer on the semiconductor substrate and a variation in oxidation rate are always present. Therefore, in active layers of some semiconductor devices, lateral oxidation progresses due to lateral diffusion of oxygen through the buried insulating film in the end portion of the active layer, and the oxidation progresses from the bottom of the end portion of the active layer. As a result, the active layer is subjected to the tension of the oxide film from its bottom surface, and this deteriorates the electrical characteristics. The progress of the lateral oxidation is also a problem in terms of miniaturization of the active layer. For these reasons, the active layer region isolating method using the selective oxidation is not applied.

As has been described above, the following effects can be obtained according to the present invention.

i) Even when a semiconductor device is formed by using a semiconductor substrate having a thin buried oxide film, a region surrounding an active layer of the semiconductor device can be constituted by a relatively thick insulating film. Therefore, it is possible to prevent an increase in parasitic capacitance in a portion where a gate electrode extends from the active region, so that the operating speed of the integrated circuit can be increased.

ii) Even in a case in which a semiconductor device is formed by using a semiconductor substrate having a thin buried oxide film, a region surrounding an active layer of the semiconductor device can be constituted by a relatively thick insulating film. Therefore, an increase in capacitance of interconnections for connecting circuits can be prevented, and this increases the operating speed of the integrated circuit.

iii) Semiconductor device manufacturing techniques which have been conventionally developed can be applied directly to the manufacturing method of the present invention. In addition, this manufacturing method does not involve any step having technical difficulty and requires only one self-alignment process.

What is claimed is:

1. A method of manufacturing a field-effect semiconductor device, comprising the steps of:

preparing a semiconductor structure in which a first insulating film is formed on a semiconductor substrate and a first semiconductor layer is formed on said first insulating layer;

processing said first semiconductor layer to have predetermined planar dimensions;

forming a second insulating film on top and side surfaces of said processed first semiconductor layer;

depositing a third non-oxidizable insulating film on a major surface of said semiconductor structure;

depositing a second semiconductor layer on said third non-oxidizable insulating film;

forming a fourth insulating film on said second semiconductor layer;

depositing a fifth non-oxidizable insulating film on said fourth insulating film;

processing said fifth non-oxidizable insulating film to have dimensions covering the region of said first semiconductor layer processed into predetermined planar dimensions;

oxidizing said second semiconductor layer by using said fifth non-oxidizable insulating film as a mask, thereby changing a major region into a semiconductor oxide;

removing said fifth non-oxidizable insulating film and said fourth insulating film remaining under said fifth non-oxidizable insulating film to expose said second semiconductor layer remaining under said fourth insulating film;

etching said second semiconductor layer to expose said third non-oxidizable insulating film on said processed first semiconductor layer;

changing said second semiconductor layer partially remaining on a periphery of said processed first semiconductor layer into an oxide; and etching said third non-oxidizable insulating film exposed on a major surface side of said semiconductor structure to expose said second insulating film.

2. A method according to claim 1, further comprising the steps of:

changing said first semiconductor layer into a semiconductor active layer of a first conductivity type;

removing said second insulating film on said semiconductor active layer to form a gate oxide film;

forming a gate electrode on said semiconductor active layer and forming an interconnection layer for connecting said gate electrode to another element;

forming an insulating layer on said semiconductor structure; and forming a source electrode and a drain electrode connected to a source region and a drain region, respectively, through contact holes formed in said insulating layer and said gate oxide film arranged below said insulating layer.

3. A method according to claim 1, wherein after said fifth non-oxidizable insulating film is processed into predetermined planar dimensions, said exposed fourth insulating film is removed to expose said second semiconductor layer under said fourth insulating film.

* * * * *

UNITED STATES PATENT AND TRADEMARK OFFICE
CERTIFICATE OF CORRECTION

PATENT NO. : 5,225,356
DATED : July 6, 1993
INVENTOR(S) : Omura et al.

It is certified that error appears in the above-indentified patent and that said Letters Patent is hereby corrected as shown below:

ON THE TITLE PAGE:

In the Title, change "SOT" to --SOI--.

Signed and Sealed this

Fifteenth Day of August, 1995

Attest:

BRUCE LEHMAN

Attesting Officer  Commissioner of Patents and Trademarks